United States Patent
Wendt et al.

(10) Patent No.: US 7,538,554 B2
(45) Date of Patent: May 26, 2009

(54) CIRCUIT ARRANGEMENT FOR DETUNING A RESONANT CIRCUIT OF AN MR APPARATUS

(75) Inventors: Matthias Wendt, Würselen (DE); Thomas Dürbaum, Baiersdorf (DE); Achim Hilgers, Alsdorf (DE); Rainer Kiewitt, Roetgen (DE); Heiko Pelzer, Erkelenz (DE)

(73) Assignee: Koninlijke Philips Electronics N.V., Eindhoven (NL)

( * ) Notice: Subject to any disclaimer, the term of this patent is extended or adjusted under 35 U.S.C. 154(b) by 12 days.

(21) Appl. No.: 10/596,147

(22) PCT Filed: Nov. 24, 2004

(86) PCT No.: PCT/IB2004/052536

§ 371 (c)(1),
(2), (4) Date: Apr. 10, 2007

(87) PCT Pub. No.: WO2005/057232

PCT Pub. Date: Jun. 23, 2005

(65) Prior Publication Data

US 2007/0268018 A1   Nov. 22, 2007

(30) Foreign Application Priority Data

Dec. 8, 2003 (EP) .................. 03104569

(51) Int. Cl.
G01V 3/00 (2006.01)
(52) U.S. Cl. ..................................... 324/322

(58) Field of Classification Search ......... 324/300–322; 600/410–435
See application file for complete search history.

(56) References Cited

U.S. PATENT DOCUMENTS

| 4,788,503 | A | 11/1988 | van Heelsbergen |
| 5,162,738 | A | 11/1992 | Sepponen |
| 5,212,450 | A * | 5/1993 | Murphy-Boesch et al. .. 324/322 |
| 5,483,158 | A | 1/1996 | van Heteren et al. |
| 5,666,055 | A * | 9/1997 | Jones et al. .................. 324/318 |
| 6,204,665 | B1 | 3/2001 | Triebe et al. |
| 6,236,205 | B1 * | 5/2001 | Ludeke et al. ............... 324/318 |
| 6,280,385 | B1 | 8/2001 | Melzer et al. |
| 6,593,744 | B2 * | 7/2003 | Burl et al. .................... 324/322 |
| 6,850,064 | B1 * | 2/2005 | Srinivasan .................. 324/318 |
| 7,026,818 | B2 * | 4/2006 | Machida et al. ............. 324/322 |
| 7,098,659 | B2 * | 8/2006 | Reykowski et al. ......... 324/309 |
| 7,180,291 | B2 * | 2/2007 | Chmielewski et al. ...... 324/318 |
| 7,205,768 | B2 * | 4/2007 | Schulz et al. ............... 324/322 |
| 7,239,139 | B2 * | 7/2007 | Findeklee ................... 324/318 |
| 2002/0145427 | A1 | 10/2002 | Wong et al. |

FOREIGN PATENT DOCUMENTS

WO   WO 01/75466 A1   10/2001

* cited by examiner

Primary Examiner—Brij B Shrivastav
Assistant Examiner—Dixomara Vargas

(57) ABSTRACT

An MR apparatus has a resonant circuit, which is formed by an MR receiving coil (L1) and a capacitor (C1), and has an electronic control circuit (S) for switching the resonant circuit between two or more operating modes. The invention proposes that the electronic control circuit (S) be connected with a receiving device (L2) for wireless reception of a high-frequency electromagnetic control signal.

11 Claims, 2 Drawing Sheets

CIRCUIT ARRANGEMENT FOR DETUNING A RESONANT CIRCUIT OF AN MR APPARATUS

BACKGROUND

The invention relates to a circuit arrangement for an MR apparatus, having a resonant circuit, which is formed by an MR receiving coil and a capacitor, and having an electronic control circuit for switching the resonant circuit between two or more operating modes.

The invention also relates to an MR apparatus having a circuit arrangement according to the invention and to an MR method employing such an MR apparatus.

MR apparatuses used primarily for medical imaging purposes are known from the prior art; separate transmitting and receiving coil arrangements are provided in these apparatuses. The purpose of the transmitting coil arrangement here is to generate high-frequency fields in the examination volume of the MR apparatus, which induce nuclear magnetization in the examination volume. The receiving coil arrangements serve to pick up MR signals from the examination volume. The receiving coil arrangements can either be in the form of volume coils, or—for optimization of sensitivity in specific regions of the examination volume—in the form of surface coils, which are placed directly on the body of a patient located in the examination volume of the MR apparatus. Such receiving coils are normally wired up with suitably adapted capacitors, so that each receiving coil has associated with it a resonant circuit of which the resonant frequency is tuned to the proton resonant frequency of the MR apparatus. To induce the nuclear magnetization in the examination volume, high-frequency pulses in the power range of several kilowatts are normally introduced by means of the transmitting coil arrangement. The frequency of the high-frequency pulses is in turn the same as the resonant frequency of the resonant circuits associated with the receiving coils. The high-frequency pulses therefore enter resonantly into the receive-side resonant circuits of the MR apparatus. The result of this is that, on the one hand, the high-frequency energy is undesirably partially absorbed by way of the receiving coil arrangement. On the other hand, the resonant input possibly causes significant heating of or even irreversible damage to the receiving coil arrangement and to the corresponding resonant circuits. When using surface coils, the resonant heating may lead to a risk of injury for the patient being examined, on whose body the surface coils are placed directly. It is also problematic that the receive-side resonant circuits are customarily connected to sensitive receiver amplifiers, the input stages of which can be damaged by the high-frequency energy introduced in transmit mode. At any rate, the receiver amplifiers are severely overdriven, so that after every excitation by means of a high-frequency pulse the entire receive electronics of the MR apparatus have an undesirably long dead time before the received MR signals can be correctly processed.

In MR apparatuses that have separate transmitting and receiving coil arrangements, it is known specifically to detune the receive-side resonant circuits during transmit mode, so that an input of high-frequency pulses into the receiving coils during transmit mode is prevented. For that purpose, suitable circuit arrangements are provided, by means of which each of the receive-side resonant circuits can be switched back and forth between a resonant operating mode and a non-resonant operating mode. The resonant operating mode is here intended for the receive mode and the non-resonant operating mode is intended for the transmit mode of the MR apparatus.

A circuit arrangement of the kind outlined above is known, for example, from US 2004/0124838. The known circuit arrangement serves for switching a resonant circuit having a MR receiving coil in the form of a microcoil between a resonant and a non-resonant operating mode. Here, the entire resonant circuit is mounted at the tip of an intervention instrument. The known circuit arrangement comprises an optoelectronic element, by means of which the resonant circuit is detuned. In the case of the known circuit arrangement, the control signal that causes detuning of the resonant circuit is a light signal, which is fed to the optoelectronic element by way of an optical waveguide.

The drawback of the system known from the prior is primarily the fact that the (optical) control signal has to be fed to the resonant circuit to be switched back and forth between the different operating modes by way of a signal line specifically intended for this. For that purpose, apart from the optical waveguide, yet further optoelectronic components are required, which do not belong to the regular equipment of customary MR apparatuses. As a technically simpler version, it would admittedly be possible for the control signal for switching between the different operating modes to be fed to the resonant circuit in the form of an electrical signal by way of conventional electrical connecting wires. But the problem inherent in this is that suitable electrical connecting wires that connect the reversible resonant circuit of the MR receiving coil to the central control unit of the MR apparatus have to be several meters long. Such long wires in turn act as receiving antennas, which the high-frequency pulses couple into in transmit mode. Here too, resonant heating phenomena can occur, which represent a corresponding risk of injury for the patient to be examined.

SUMMARY

Taking this as starting point, it is an object of the invention to provide a circuit arrangement for an MR apparatus for switching a receive-side resonant circuit between different operating modes, wherein the circuit arrangement can be simply and inexpensively realized and can be used without any risk of injury for the patient.

That object is achieved by the invention by a circuit arrangement in which the electronic control circuit is connected with a receiving device for wireless reception of a high-frequency electromagnetic control signal.

Through the use of a high-frequency electromagnetic control signal, that is, a radio signal, for activating the resonant circuit, any physical connection between the receive-side resonant circuit and the central control unit of the MR apparatus can be omitted. There is no risk of injury for the patient being examined since the high-frequency electromagnetic control signals for switching over the resonant circuit place at least no more stress on him than the high-frequency fields to which he is exposed anyway during the transmit mode of the MR apparatus. The electronic control circuit required to switch over the resonant circuit, together with the associated receiving device for wireless reception of the control signal, can be realized with standard components at low cost. In particular, the expensive optoelectronics that are required in the case of the system known from the above-mentioned printed publication can be omitted.

An especially practicable version of the circuit arrangement according to the invention is produced when the receiving device is formed by the MR receiving coil itself, switching over of the resonant circuit being controllable by means of the control circuit in dependence on the amplitude of the high-frequency signal present at the MR receiving coil. By means of the control circuit, the terminal voltage present at the MR receiving coil is detected, and, when a pre-determinable switching threshold is exceeded, the resonant circuit of the MR receiving coil is switched over to the non-resonant operating mode. If in transmit mode of the MR apparatus a high-frequency pulse is input, then this couples first into the MR receiving coil and thus causes the terminal voltage present at the MR receiving coil to exceed the threshold value. After that, switching over into the non-resonant operating mode is effected, so that the resonant circuit and the receiving electronics in connection therewith are protected.

Alternatively, the receiving device can be formed by an additional resonant circuit, which is tuned to a different resonant frequency from the resonant circuit formed by the MR receiving coil and the associated capacitor. To switch the resonant circuit of the MR receiving coil into the non-resonant operating mode, in this version a high-frequency electromagnetic control signal is sent, to be precise, at the resonant frequency of the additional resonant circuit, this frequency differing from the MR resonant frequency. At the same time, the control signal can advantageously have a very low transmitting power, which does not stress the patient in any way. If there are several independent MR receiving coils with associated resonant circuits, these can either each have an additional resonant circuit, which is tuned to a single common frequency of the control signal, so that all receive-side resonant circuits can be switched with a single control signal between the different operating modes. Alternatively, each receive-side resonant circuit can have an additional resonant circuit each having a different resonant frequency, so that by appropriate selection of the frequency of the control signal, individual receive-side resonant circuits can be switched over specifically.

The additional resonant circuit of the last-described version of the circuit arrangement according to the invention can advantageously be connected to a rectifier circuit for generating a low-frequency switch-over signal. From the high-frequency control signal received by the additional resonant circuit, the rectifier circuit generates the low-frequency switch-over signal that is required within the electronic control circuit of the circuit arrangement according to the invention for switching between the possible operating modes. According to this version, it is advantageous that the energy supply for switching over is applied by the received electromagnetic control signal itself, so that the circuit arrangement according to the invention manages entirely without its own energy supply and without active circuit components.

In an advantageous further aspect of the circuit arrangement, the control circuit comprises a time-delay circuit that is constructed so that the resonant circuit formed by the MR receiving coil and the associated capacitor, on receipt of the control signal, is switched over into an activated or a deactivated operating mode, and thereafter remains in that operating mode for a time interval of pre-determinable duration. It is thus possible, for example, shortly before the introduction of a high-frequency pulse in transmit mode of the MR apparatus to transmit the control signal in order to switch over the resonant circuit of the MR receiving coil into the non-resonant operating mode. The time-delay circuit ensures that the receive-side resonant circuit remains in this de-activated operating mode for the duration of the transmit mode of the MR apparatus. Once the transmit mode has ended, the resonant circuit MR receiving coil is automatically switched back into the activated, that is, resonant operating mode. Alternatively, the circuit arrangement can be constructed so that shortly before the start of the receive mode the resonant circuit is switched by means of the control signal from the non-resonant operating mode intended for the transmit mode into the resonant operating mode, and by virtue of the time-delay circuit remains in this resonant operating mode throughout reception of the MR signals.

In a further possible embodiment of the circuit arrangement, the receiving device is constructed to receive radio signals of a radio control. Commercial radio control components can accordingly be used to realize the invention.

The circuit arrangement according to the invention can be used for an MR apparatus.

In addition, the circuit arrangement according to the invention can be used in an MR method to generate an image of an examination object, the image being reconstructed from MR signals that are picked up from the examination volume after input of a high-frequency pulse, and the resonant circuit formed by the MR receiving coil and the associated capacitor being switched by additional generation of a high-frequency electromagnetic control signal between an activated and a de-activated operating mode, such that the resonant circuit is in the de-activated operating mode during input of the high-frequency pulse. Here, as stated above, the control signal may have a different frequency from the high-frequency pulse and in particular the control signal can be generated before or after the high-frequency pulse if the control circuit is equipped with the above-described time-delay circuit.

The method according to the invention can be made available to the user of MR apparatuses in the form of a corresponding computer program. The computer program can be stored on suitable storage media, for example CD Rom or diskette, or it can be downloaded via the internet onto the computer unit of the MR apparatus.

BRIEF DESCRIPTION OF THE DRAWINGS

These and other aspects of the invention are apparent from and will be elucidated with reference to the embodiments described hereinafter.

In the drawings.

DETAILED DESCRIPTION

Figure 1:
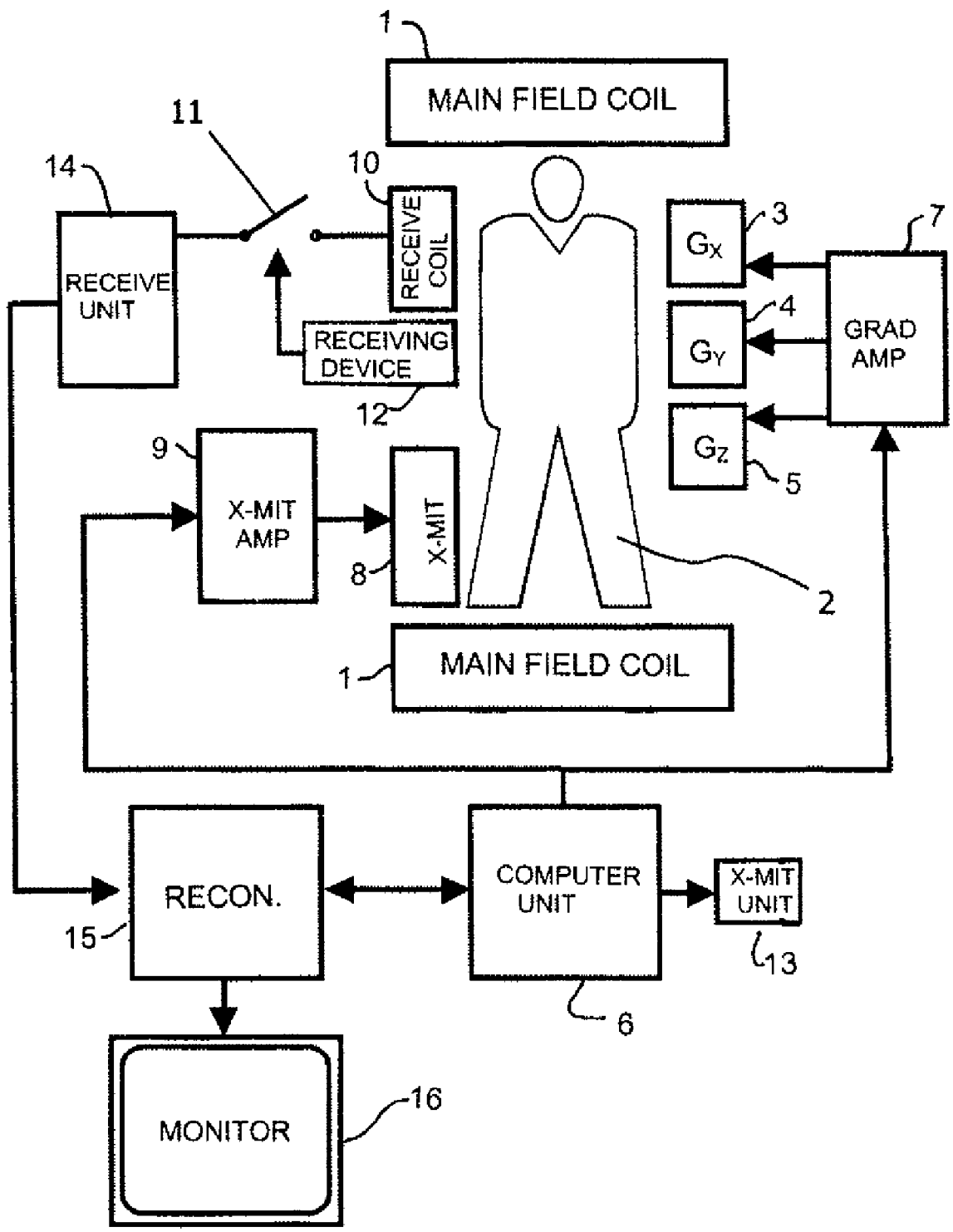
FIG. 1 shows the MR apparatus according to the invention.

FIG. 1 shows an MR apparatus according to the invention in the form of a block diagram. The apparatus comprises a main field coil 1 for generating a homogeneous, static magnetic field in an examination volume, in which there is a patient 2. The MR apparatus illustrated furthermore comprises gradient coils 3, 4 and 5 for generating magnetic field gradients in different directions in space within the examination volume. By means of a computer unit 6, which is connected via a gradient amplifier 7 to the gradient coils 3, 4 and 5, the variation with time of the magnetic field gradients within the examination volume is controlled. A transmitting coil 8 for generating high-frequency fields in the examination volume also forms part of the MR apparatus. The transmitting coil is in connection by way of a transmitting amplifier 9 with the computer unit 6. An MR receiving coil 10, which is part of a resonant circuit not illustrated in FIG. 1, is used to pick up MR signals from the examination volume. A control circuit, which is symbolized in FIG. 1 by a switch 11, is provided to switch the resonant circuit between two or more operating modes. The switch 11 is activated by a receiving device 12, the receiving device 12 being constructed for wireless reception of a high-frequency electromagnetic control signal. A transmitting unit 13, which in its turn is in connection with the computer unit 6, is used to transmit the control signal. Alternatively, the transmitting coil 8 that is already present can be used for transmitting the control signal. Switching the resonant circuit between the different operating modes is therefore monitored by the computer unit 6. The MR receiving coil is in connection via the switch 11 with a receiving unit 14, which is used to amplify and to demodulate the received MR signals. The MR signals thus processed are transmitted to a reconstruction and visualization unit 15. An image reconstructed from the MR signals can be displayed by means of a monitor 16. The computer unit 6 possesses a program control, by which the above-described MR method can be implemented on the MR apparatus.

Figure 2:
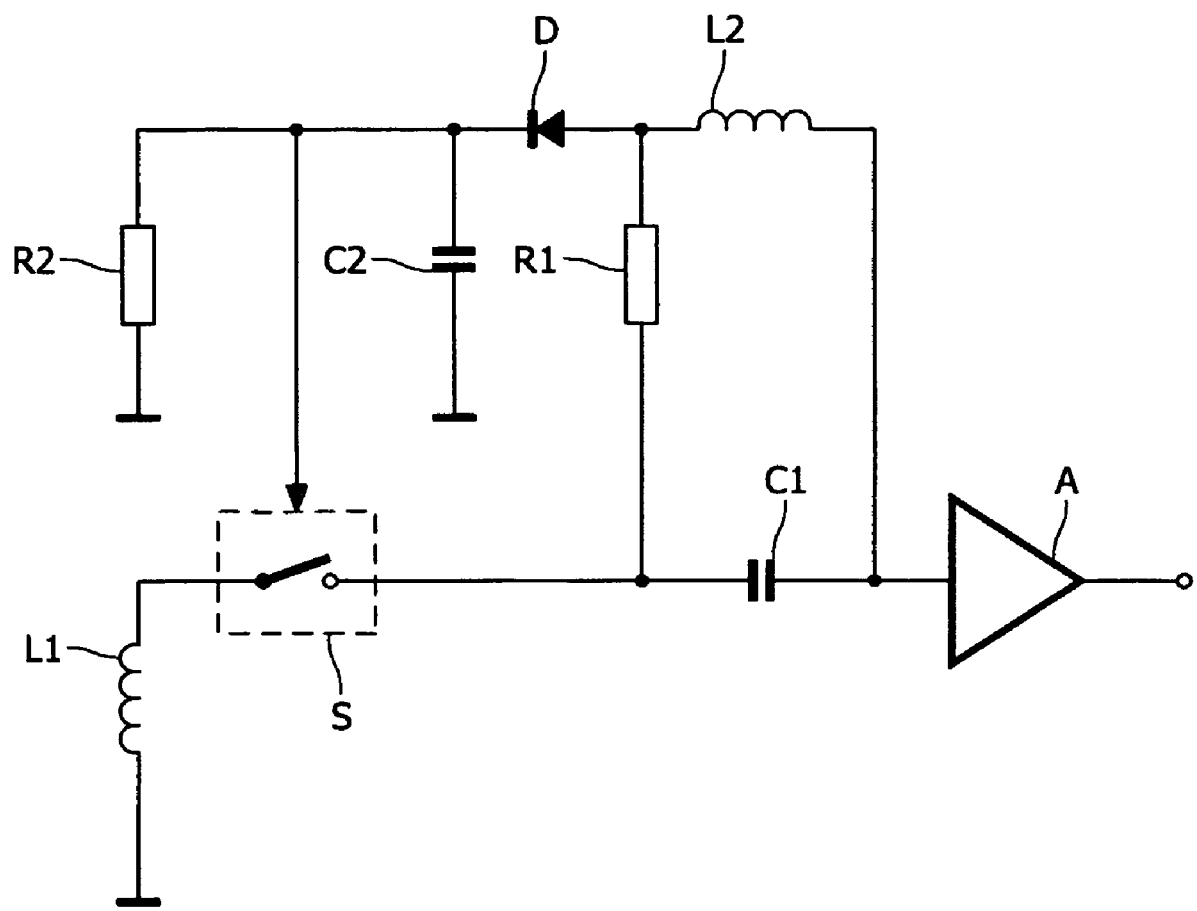
FIG. 2 shows the circuit arrangement according to the invention.

The circuit arrangement illustrated in FIG. 2 comprises a resonant circuit, which is formed by an MR receiving coil L1 and a capacitor C1. An electronic switch S is provided for switching the resonant circuit between two or more operating modes. In a de-activated operating mode, in which according to the invention is it intended to prevent high-frequency radiation from coupling into the resonant circuit, the electronic switch S is open. In this operating mode, above all a sensitive receiver amplifier A is prevented from suffering damage or at least from being overdriven. In an activated operating mode, the switch S is closed, so that the resonant circuit formed by the MR receiving coil L1 and the associated capacitor C1 is resonant and MR signals can be received. In the case of the circuit arrangement illustrated in FIG. 2, an additional receiving coil L2 is provided as well, and together with the capacitor C1 this forms an additional resonant circuit, which is tuned to a different resonant frequency from the resonant circuit formed by the MR receiving coil L1 and the associated capacitor C1. This additional resonant circuit serves to receive a high-frequency electromagnetic control signal, which has a different frequency from the frequency of the MR signals to be received. The control signal received by means of the additional resonant circuit decays across a resistor R1 and is rectified by means of a diode D. A low-frequency switching signal for switching the change-over switch S is thereby produced. The control circuit furthermore comprises a time-delay circuit, which is formed by a capacitor C2 and a resistor R2. The capacitor C2 is charged by the received control signal. Discharge of the capacitor C2 is effected after termination of the input of the control signal via the resistor R2. The capacitor C2 and the resistor R2 define a time constant, so that, on receipt of the high-frequency control signal, the resonant circuit formed by the MR receiving coil L1 and the associated capacitor C1 is switched by means of the additional resonant circuit firstly into the de-activated operating mode and thereafter remains in that operating mode throughout the time predetermined by the time constant, even when the control signal is no longer present. Alternatively, the circuit arrangement illustrated in FIG. 2 can be constructed so that the change-over switch S is closed by the low-frequency switching signal, so that the resonant circuit for receiving MR signals, formed by the MR receiving coil L1 and the associated capacitor C1, is switched out of the de-activated operating mode into the activated resonant operating mode and then remains in that operating mode throughout the corresponding time interval.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A circuit arrangement for an MR apparatus which has an MR resonant circuit formed by an MR receiving coil and a capacitor and tuned to resonate at a magnetic resonance frequency in an activated operating mode to receive magnetic resonance frequency signals from an examination region, the circuit arrangement comprising:
   a switch for switching the MR resonant circuit between the activated operating mode and an inactive mode;
   a control device for wireless reception of a control signal, the control signal being at a radio frequency which is different from the magnetic resonance frequency, the control device being connected with the switch to switch the MR resonant circuit between the inactive mode and the active mode in response to receiving the control signal.

2. An MR apparatus comprising:
   a main field coil for generating a substantially homogeneous, static magnetic field in an examination volume,
   a transmitting coil for generating MR excitation pulses in the examination volume,
   a computer unit for controlling the MR apparatus, and
   the circuit arrangement as claimed in claim 1 for controlling the switching of the MR receiving coil between the inactive and active modes.

3. An MR method for generating an image of an examination object using the MR apparatus as claimed in claim 2, comprising:
   reconstructing an image from the magnetic resonance frequency signals that are received from the examination volume in response to an MR excitation pulse, and
   switching the MR resonant circuit formed by the MR receiving coil and the associated capacitor in response to the control signal between an activated operating mode and a de-activated operating mode, such that the MR resonant circuit is in the de-activated operating mode during input of the MR excitation pulse.

4. The MR method as claimed in claim 3, wherein the control signal is generated before or after the MR excitation pulse.

5. A computer program for controlling an MR apparatus to perform the method as claimed in claim 3.

6. The method as claimed in claim 3, further including:
   rectifying the received control signal to generate a low frequency switching signal which triggers switching of the MR resonant circuit formed by the MR receiving coil and the associated capacitor between the activated and deactivated operating modes.

7. The method as claimed in claim 3, further including:
   switching the MR resonant circuit to the deactivated operating mode in response to the control signal,
   holding the MR resonant circuit in the deactivated operating mode for a predetermined interval of time, and
   after the predetermined interval of time, switching the MR resonant circuit back to the operative mode.

8. A magnetic resonance receive coil assembly comprising:
   an MR receiving coil for receiving MR signals;
   a capacitor to tune the MR receiving coil to a frequency of the MR signals; and
   the circuit arrangement as claimed in claim 1 which connects and disconnects the MR receiving coil and the capacitor in response to receiving the control signal to switch the MR receiving coil between the active mode and the inactive mode.

9. A circuit arrangement for an MR apparatus, the circuit arrangement comprising:
- a resonant circuit which is formed by an MR receiving coil and a capacitor,
- an electronic control circuit for switching the resonant circuit between two or more operating modes,
- a receiving device for wireless reception of a high-frequency electromagnetic control signal, the receiving device being connected with the control circuit, the receiving device including an additional resonant circuit which is tuned to a different resonant frequency from the resonant circuit formed by the MR receiving coil and the associated capacitor, the additional resonant circuit being connected to a rectifier circuit for generating a low-frequency switching signal.

10. The circuit arrangement as claimed in claim 9, wherein the receiving device is constructed for receiving radio control signals from a radio control device.

11. A circuit arrangement for an MR apparatus, having a resonant circuit formed by an MR receiving coil and a capacitor, the circuit arrangement comprising:
- an electronic control circuit which switches the resonant circuit between two or more operating modes;
- a receiving device for wireless reception of a high-frequency electromagnetic control signal connected with the electronic control circuit, the control circuit including a time-delay circuit that is constructed such that the resonant circuit formed by the MR receiving coil and the associated capacitor, upon receipt of a control signal, is switched into an activated or de-activated operating mode, and thereafter remains in that operating mode for a time interval of pre-determinable duration.

* * * * *